US008288255B2

(12) United States Patent
Lu et al.

(10) Patent No.: US 8,288,255 B2
(45) Date of Patent: Oct. 16, 2012

(54) N-TYPE DOPING OF ZINC TELLURIDE

(75) Inventors: Xianfeng Lu, Beverly, MA (US); Ludovic Godet, Boston, MA (US); Anthony Renau, West Newbury, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 13/364,415

(22) Filed: Feb. 2, 2012

(65) Prior Publication Data

US 2012/0202341 A1 Aug. 9, 2012

Related U.S. Application Data

(63) Continuation-in-part of application No. 13/021,064, filed on Feb. 4, 2011.

(51) Int. Cl.
*H01L 21/265* (2006.01)
*H01L 21/425* (2006.01)

(52) U.S. Cl. ........ 438/518; 438/519; 438/522; 438/527; 438/530; 257/E21.068

(58) Field of Classification Search ................... 438/518, 438/519, 522, 527, 530; 257/E21.068
See application file for complete search history.

(56) References Cited

U.S. PATENT DOCUMENTS

| | | | |
|---|---|---|---|
| 3,732,471 A | 5/1973 | Hou et al. | |
| 2004/0155255 A1 | 8/2004 | Yamamoto et al. | |
| 2005/0189553 A1 | 9/2005 | Kishino et al. | |
| 2008/0023732 A1 | 1/2008 | Felch et al. | |
| 2008/0089831 A1* | 4/2008 | Yamamoto et al. | 423/508 |
| 2008/0090327 A1* | 4/2008 | Yamamoto et al. | 438/102 |
| 2008/0090328 A1* | 4/2008 | Yamamoto et al. | 438/102 |
| 2008/0090386 A1* | 4/2008 | Yamamoto et al. | 438/478 |
| 2008/0090390 A1* | 4/2008 | Yamamoto et al. | 438/505 |
| 2010/0022076 A1 | 1/2010 | Godet et al. | |

FOREIGN PATENT DOCUMENTS

| | | |
|---|---|---|
| JP | 2002241199 A | 8/2002 |
| JP | 2009088248 A | 4/2009 |

OTHER PUBLICATIONS

F.J. Bryant, et al., Ion Implanation in Group II-VI Compounds, Progress in Crystal Growth and Characterization, Jan. 1, 1983, pp. 191-263, vol. 6, No. 2, Pergamon Press, Oxford, Great Britain.
P.J. Dean, et al, Inter-impurity Recombinations in Semiconductors, Progress in Solid State Chemistry, Jan. 1, 1973, pp. 1-126, vol. 8, Pergamon Press, Oxford, Great Britain.
J.H. Chang et al., Aluminum-doped N-type ZnTe Layers Grown by Molecular-Beam Epitaxy, Applied Physics Letters, Aug. 6, 2001, 785-787, vol. 79, No. 6, American Institute of Physics.

* cited by examiner

*Primary Examiner* — Kevin Parendo (57) ABSTRACT

ZnTe is implanted with a first species selected from Group III and a second species selected from Group VII. This may be preformed using sequential implants, implants of the first species and second species that are at least partially simultaneous, or a molecular species comprising an atom selected from Group III and an atom selected from Group VII. The implants may be performed at an elevated temperature in one instance between 70° C. and 800° C.

20 Claims, 7 Drawing Sheets

N-TYPE DOPING OF ZINC TELLURIDE

CROSS-REFERENCE TO RELATED APPLICATIONS

This application is a continuation-in-part of U.S. application Ser. No. 13/021,064, filed Feb. 4, 2011, the disclosure of which is hereby incorporated by reference.

FIELD

This invention relates to doping zinc telluride (ZnTe) and, more particularly, to n-type doping of ZnTe.

BACKGROUND

Ion implantation is a standard technique for introducing conductivity-altering impurities into a workpiece. A desired impurity material is ionized in an ion source, the ions are accelerated to form an ion beam of prescribed energy, and the ion beam is directed at the surface of the workpiece. The energetic ions in the beam penetrate into the bulk of the workpiece material and are embedded into the lattice of the workpiece material to form an implanted region.

Workpieces or films on workpieces may be composed of many different materials. For example, ZnTe is a wide band gap semiconductor material with a direct band gap of around 2.25 eV. ZnTe may be used in ultra-high efficiency solar cells, pure green light emitting diodes (LEDs), laser diodes, opto-electronic detectors, compound semiconductors, and other applications known to those skilled in the art. However, it is difficult to perform n-type doping of ZnTe or ZnTe workpieces. In-situ doping during ZnTe growth has been performed, such as using molecular beam epitaxy (MBE) or metalorganic chemical vapor deposition (MOCVD). Doping during ZnTe growth cannot control the Zn vacancy concentration, which is one mechanism that prevents n-type doping of ZnTe. This is at least partly because in-situ doping during ZnTe growth involves competition between dopants and Zn atoms. This competition results in Zn vacancies. The existence of Zn vacancies is a p-type characteristic and will compensate for n-type doping of ZnTe. What is needed is a new method of doping ZnTe and, more particularly, n-type doping of ZnTe.

SUMMARY

According to a first aspect of the invention, a method of doping is provided. The method comprises implanting a ZnTe layer with a first species selected from Group III. The ZnTe layer also is implanted with a second species selected from Group VII.

According to a second aspect of the invention, a method of doping is provided. The method comprises implanting a ZnTe layer with a first species selected from Group III and a second species selected from Group VII. The ZnTe layer is at a temperature between 70° C. and 800° C. during the implantation of the first species and second species.

According to a third aspect of the invention, a method of doping is provided. The method comprises implanting a ZnTe layer with a molecular species comprising an atom selected from Group III and an atom selected from Group VII.

BRIEF DESCRIPTION OF THE DRAWINGS

For a better understanding of the present disclosure, reference is made to the accompanying drawings, which are incorporated herein by reference and in which.

DETAILED DESCRIPTION

These methods are describe herein in connection with an ion implanter. However, while a beam-line ion implanter is specifically described, other systems and processes involved in semiconductor manufacturing or other systems that use plasma or generate ions also may be used. Some examples include a plasma doping tool, a plasma immersion tool, a flood implanter, an implanter that focuses a plasma or ion beam, or an implanter that modifies the plasma sheath. Thus, the invention is not limited to the specific embodiments described below.

Figure 1:
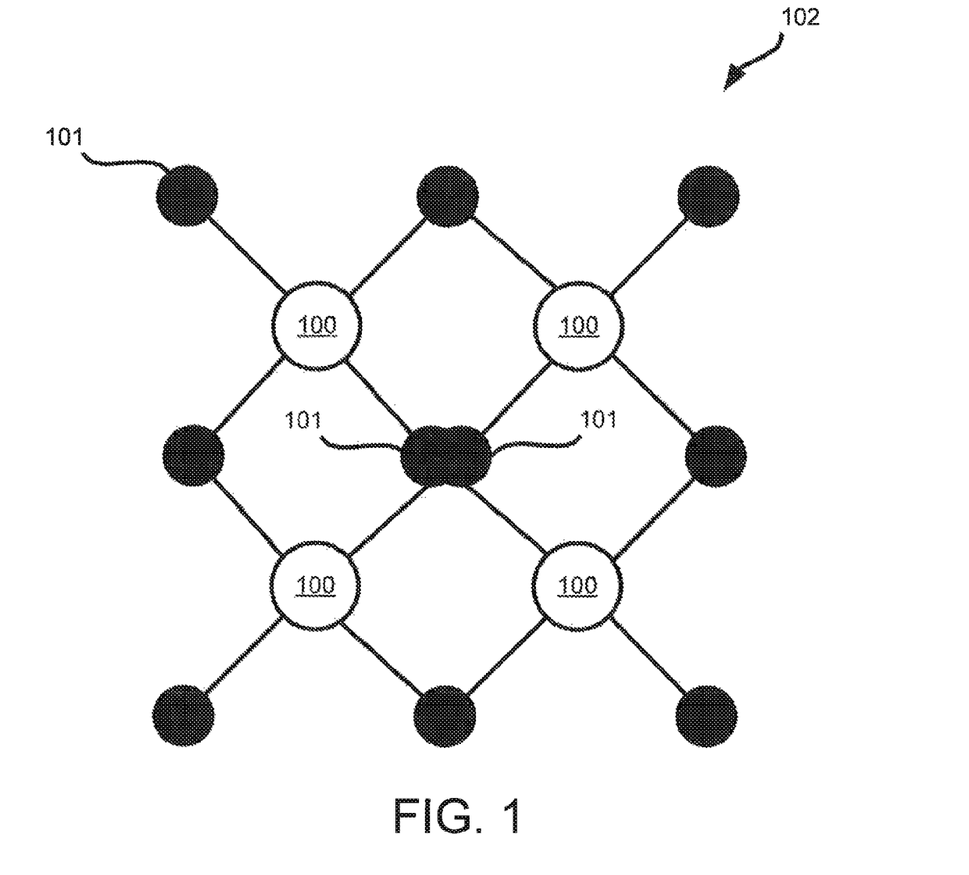
FIG. 1 is a view of one embodiment of a ZnTe crystal structure.

FIG. 1 is a view of one embodiment of a ZnTe crystal structure 102. ZnTe may have a cubic crystal structure like a diamond. However, ZnTe may have other crystal structures such as hexagonal (wurzite), polycrystalline, or amorphous. The ZnTe crystal structure 102 illustrated in FIG. 1 includes Zn atoms 100 and Te atoms 101 (illustrated as black in FIG. 1). The illustration in FIG. 1 is a two-dimensional approximation of a three-dimensional structure. Thus, some atoms in the ZnTe crystal structure 102 would go into or out of the page.

Figure 2:
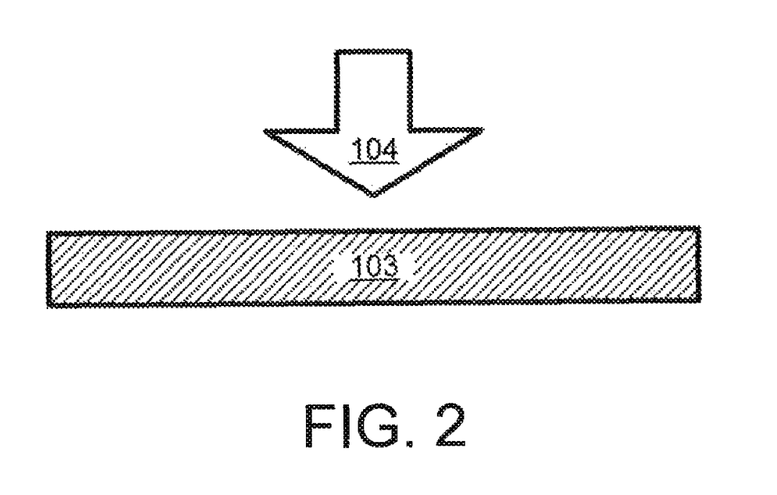
FIG. 2 is a cross-sectional view of implanting a workpiece with a first species.

FIG. 2 is a cross-sectional view of implanting a workpiece with a first species. A workpiece 103, which is ZnTe or has a ZnTe film on at least one surface, is grown. Thus, the workpiece 103 may be or may contain a ZnTe layer. So while the term "workpiece" is used herein, a ZnTe layer also may be processed using the embodiments disclosed herein. MBE, for example, may be used to grow the workpiece 103, though other methods are possible.

The workpiece 103 is implanted with a first species 104. This first species 104 is selected from Group III. Examples of the first species 104 include B, Al, Ga, and In. Of course, other ions may be implanted as the first species 104. The first species 104 implants the entirety of the workpiece 103, though implants to particular depths or to particular regions also are possible.

Figure 3:
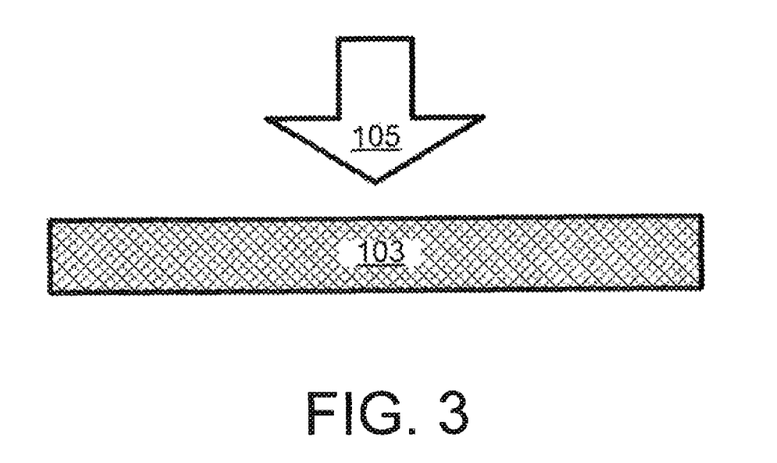
FIG. 3 is a cross-sectional view of implanting a workpiece with a second species.

FIG. 3 is a cross-sectional view of implanting a workpiece with a second species. The workpiece 103 is then implanted with a second species 105. This second species 105 is selected from Group VII. Examples of the second species 105 include F, Cl, Br, and I. Of course, other ions may be implanted as the second species 105. The second species 105 implants the entirety of the workpiece 103, though implants to particular depths or to depths different than that of the first species 104 are possible.

While the second species 105 is shown being implanted after the first species 104, the implantation may be performed in either order. In another particular embodiment, the first species 104 and second species 105 are implanted simultaneously or at least partially simultaneously. In one example, a cocktail or plasma containing both the first species 104 and second species 105 is formed and implanted into the workpiece 103 at the same time. In yet another particular embodiment, the first species 104 and second species 105 are implanted sequentially without breaking vacuum around the workpiece 103. While the entire workpiece 103 is illustrated as being implanted in FIGS. 2-3, in an alternate embodiment only a portion of the workpiece 103 or a certain region of the workpiece 103 is implanted.

In a first instance, the first species 104 is Ga and the second species 105 is I. In a second instance, the first species 104 is Al and the second species 105 is Cl. The combinations can enhance a doping effect because Ga or Al will replace Zn atoms in the ZnTe and I or Cl will replace Te atoms in the ZnTe. Other combinations of first species 104 and second species 105 are possible. These are merely examples. The first species 104 and second species 105 may be generated from atomic or molecular feed gases in one embodiment.

In one particular embodiment, the implantation of the first species 104 or second species 105 may be followed by an anneal. For example, a laser or flash anneal may be performed. This anneal recrystallizes the workpiece 103. Laser annealing, for example, may activate the first species 104 and second species 105 without producing additional Zn vacancies. The time duration of the anneal may be configured to reduce the number of Zn vacancies produced. Annealing using a laser anneal or flash anneal may minimize the competition process between the implanted species and Zn vacancies, which may reduce the Zn vacancy concentration. In an alternate embodiment, rapid thermal anneal (RTA) or other annealing methods may be used.

In another embodiment, the implantation of the first species 104 or second species 105 may be performed at an elevated temperature. In one instance, the workpiece 103 is pre-heated prior to the implantation steps to above room temperature. In another instance, the workpiece 103 is heated during the implantation steps. For example, the workpiece 103 may be pre-heated or heated to between approximately 70° C. and 800° C. In one particular embodiment, the workpiece 103 heated to between approximately 300° C. and 800° C. during implantation. Implantation at an elevated temperature may reduce damage to the crystal lattice of the workpiece 103 or may repair or anneal damage to the crystal lattice of the workpiece 103. Reduced damage may enable particular annealing methods that are less effective with more damage to the crystal lattice. The temperature of the workpiece 103 is configured to reduce or prevent diffusion of the species implanted into the workpiece 103. Furthermore, the temperature of the workpiece 103 is configured to reduce or prevent amorphization of the workpiece 103 due to implant. Partial amorphization may occur in one instance if this partial amorphization can be removed using, for example, a laser anneal or flash anneal. In one particular embodiment, the workpiece 103 is heated during implantation to a varying temperature. This temperature may be ramped or otherwise adjusted during the implantation or between the implantation of the first species 104 and second species 105.

Figure 4:
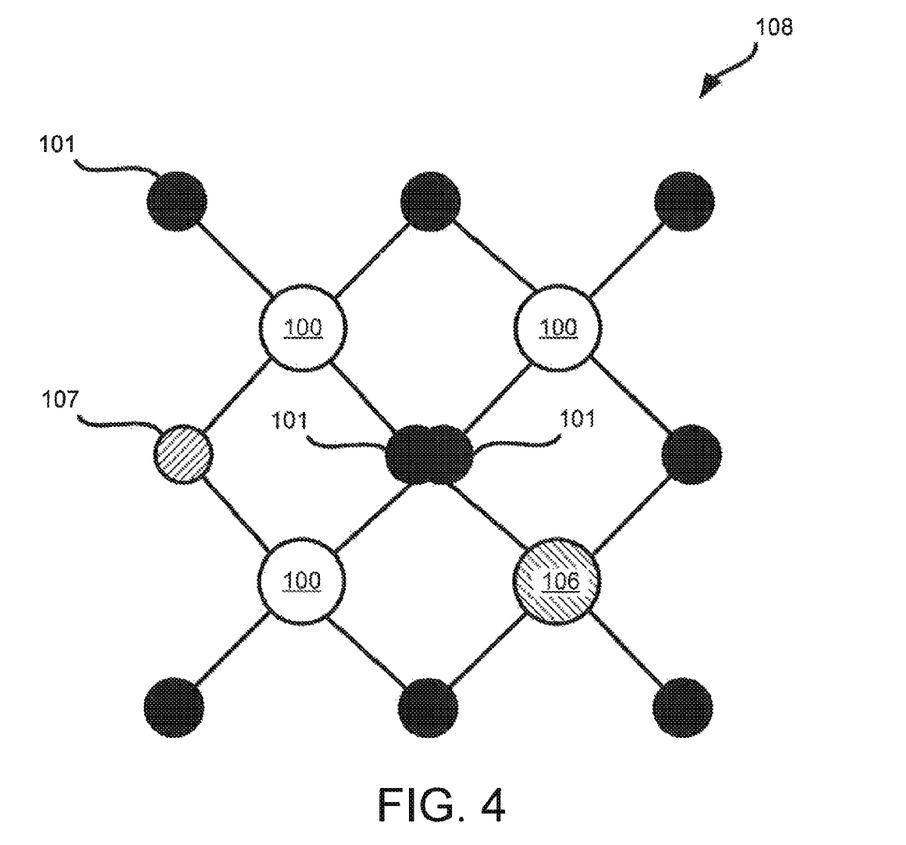
FIG. 4 is a view of one embodiment of a doped ZnTe crystal structure.

FIG. 4 is a view of one embodiment of a doped ZnTe crystal structure. The implanted ZnTe crystal structure 108 includes Zn atoms 100, Te atoms 101, first species atoms 106, and second species atoms 107. The first species atoms 106 are selected to have a size similar to the Zn atoms 100 in one instance. The second species atoms 107 are selected to have a size similar to the Te atoms 101 in a second instance. The first species atoms 106, which may be from Group III, replace Zn atoms 100 in the ZnTe crystal structure 108. The second species atoms 107, which may be from Group VII, replace Te atoms 101 in the ZnTe crystal structure 108. Similar-sized atoms may reduce stress or strain within the implanted ZnTe crystal structure 108 because the lattice mismatch between the host material, the first species atoms 106, and the second species atoms 107 is minimized. Dose and energy during implantation of the first species atoms 106 and second species atoms 107 are configured to obtain the desired dopant incorporation in the implanted ZnTe crystal structure 108.

In an alternate embodiment, the first species atoms 106, which may be from Group III, have a size larger than the Zn atoms 100. The second species atoms 107, which may be from Group VII, may be smaller than the Te atoms 101. This combination or other suitable combinations also may reduce stress or strain within the implanted ZnTe crystal structure 108.

Implanting smaller ions than the examples listed herein into the implanted ZnTe crystal structure 108 may induce strain in the crystal lattice. For example, B and F may be implanted to induce strain. This occurs because the Zn atoms 100, atomic weight 65.39, and Te atoms 127.60, are fairly large compared to smaller n-type dopants. Implantation of smaller ions to cause strain may be beneficial for certain applications.

Figure 5:
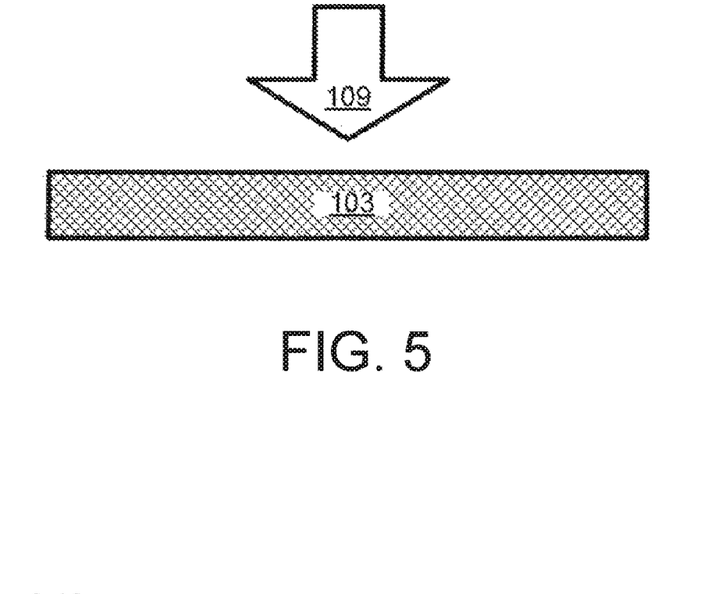
FIG. 5 is a cross-sectional view of implanting a workpiece with a molecule.

FIG. 5 is a cross-sectional view of implanting a workpiece with a molecule. The workpiece 103 is implanted with a molecular species 109. This molecular species 109 contains both an atom from Group III and an atom from Group VII. For example, the molecular species 109 may be $BF_3$ ions. The molecular species 109 also may contain a combination of B, Ga, or Al and F, Cl, or I such as $BI_3$ or $BCl_3$. Of course, other examples of the molecular species 109 are possible. While the entire workpiece 103 is illustrated as being implanted in FIG. 5, in an alternate embodiment only a portion of the workpiece 103 or a certain region of the workpiece 103 is implanted.

In another embodiment, implantation of the first species and second species or the atoms of the molecular species is to approximately the same depth in the workpiece. The implant energies or doses of the first species and second species or the implant energies or doses of the molecular species may be configured to attain a particular depth. Different implant energies or doses may be needed in part due to the size, mass, or charge of the ions or molecule. This may result in approximately matching profiles when implanting two species or two different atoms within a molecular species. Placing the two species or two different atoms at the same depth may provide benefits during the anneal. For example, placing the two species or two different atoms near one another provides local stabilization.

In one instance, B and F were implanted into a ZnTe workpiece. The B was implanted at 8 keV and the F was implanted at 13 keV. This resulted in the B and F both being implanted to the same depth of 20 nm within the ZnTe workpiece.

The dose of the two species or two different atoms may be controlled at a particular implant depth. Particular doses influence the doping process. For example, if more of one atom or species exists at a particular depth than the other atom or species, then the ZnTe workpiece may be counterdoped.

The atomic ratio of the two species or two different atoms also may be controlled at a particular implant depth. This also may provide benefits during the anneal such as better stabilization of the lattice, For example, more F than B may be needed during implantation because some F may be lost in the annealing step. Also, a specific atomic ratio may be used to stabilize the doped structure. This atomic ratio may be 1:1, but may vary based on the particular species or atoms or on the particular depth within the ZnTe workpiece.

In one embodiment, a beam-line ion implanter is used to adjust the implant depth, implant energy, or dose. In another instance, a plasma tool is used. In one example, a plasma is generated from $BF_3$ in a plasma tool such as a plasma doping tool. The ZnTe workpiece rests on a platen in a process chamber where the plasma is generated. Such a tool may modify the power that generates the plasma and the bias to the platen on which the ZnTe workpiece rests. The bias to the platen may be equivalent to changing the implant energy.

Figure 8:
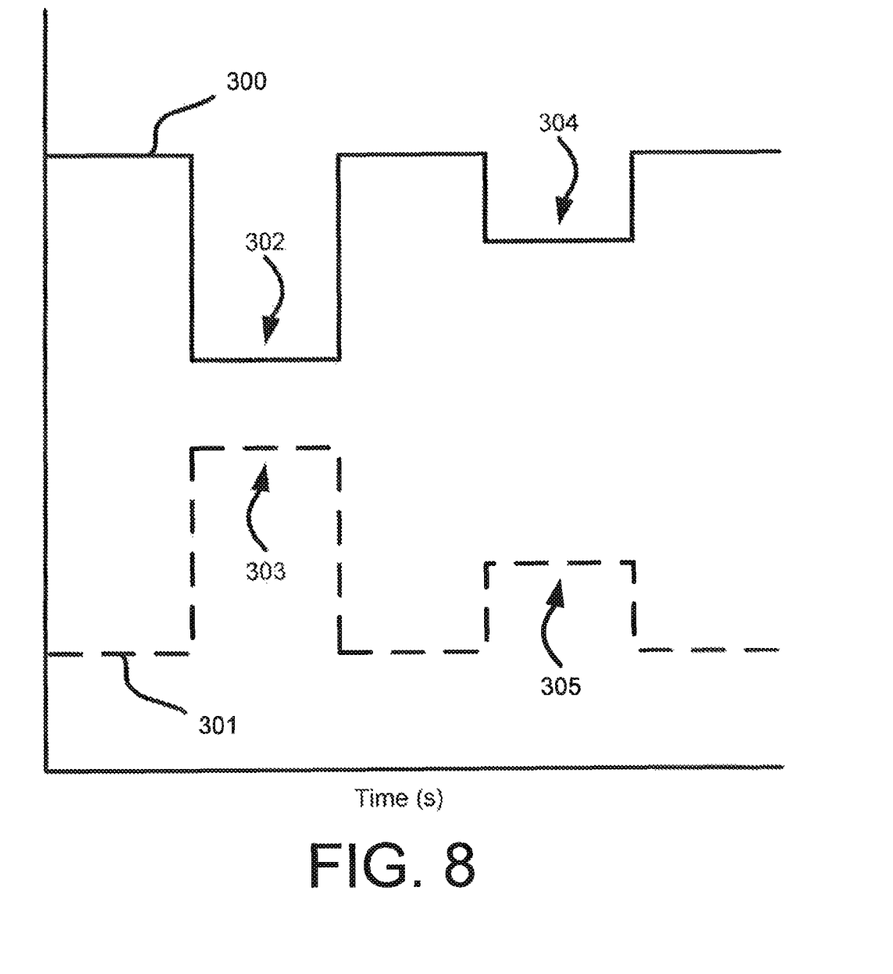
FIG. 8 is a diagram comparing power and bias voltage in a first embodiment.

FIG. 8 illustrates one possible embodiment using a plasma doping tool. The line 300 represents bias voltage to the ZnTe workpiece and the line 301 (dotted in FIG. 8) represents the power used to generate the plasma. The first voltage 302 and first power 303 occur at substantially the same time. The second voltage 304 and second power 305 also occur at substantially the same time. The second voltage 304 is less than the first voltage 302. The second power 305 is less than the first power 303. The first power 303 and second power 305 may generate plasmas with different ion densities for specific species. For example, with a plasma based on $BF_3$ the first power 303 may predominantly create a higher F ion plasma density and the second power 305 may predominantly create a higher B ion plasma density. The difference in the first voltage 302 and second voltage 304 may ensure that the two species are implanted to a substantially similar depth within the ZnTe workpiece or to form a substantially similar implant profile within the ZnTe workpiece. Of course, other voltage or power combinations may be used. The embodiment of FIG. 8 is merely an example.

In one instance, $BF_3$ was implanted into the ZnTe workpiece using an embodiment similar to that illustrated in FIG. 8 followed by a flash anneal, photoluminescence, and ellipsometry measurements. The B and F were incorporated into the ZnTe workpiece after the anneal. A new photoluminescence peak around 690 nm (1.8 eV) appeared due to the B and F implantation. Ellipsometry measurements indicated the presence of a doped ZnTe layer at the surface of the ZnTe workpiece.

Figure 6:
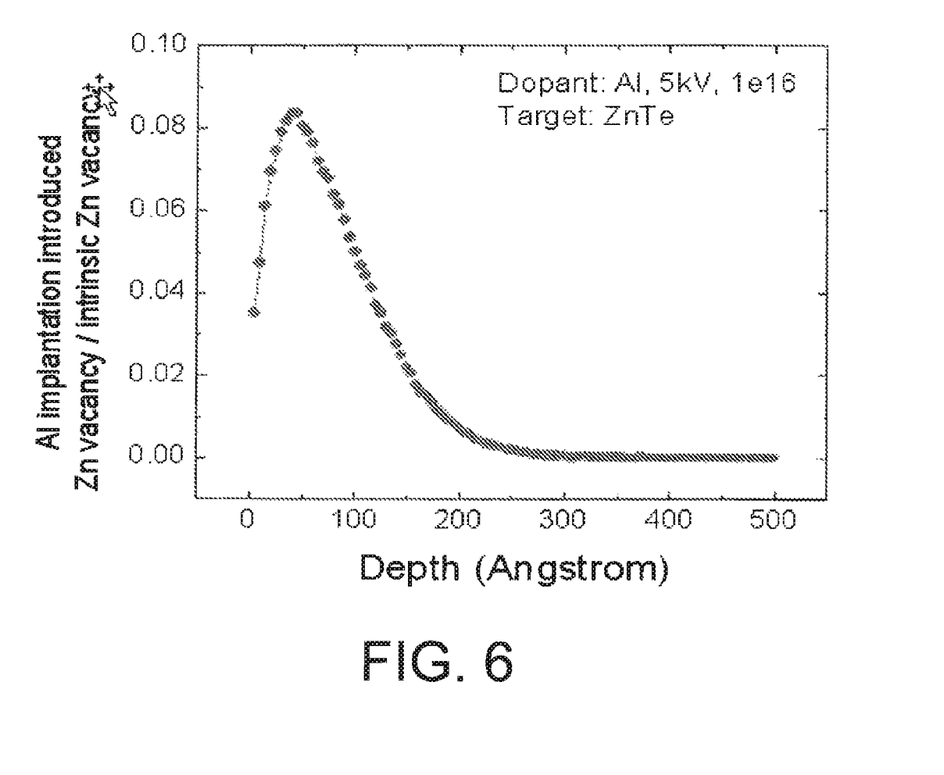
FIG. 6 is a chart comparing implantation introduced Zn vacancies per intrinsic Zn vacancy to depth.

The embodiments disclosed herein may introduce fewer Zn vacancies than in-situ doping, such as that performed by MBE or MOCVD, because there is less competition between dopants and the Zn than by in-situ doping during ZnTe growth. FIG. 6 is a chart comparing implantation introduced Zn vacancies per intrinsic Zn vacancy to depth. The Zn vacancies in FIG. 6 are caused by Al implantation at 5 kV and 1E16 $cm^{-2}$. In one particular example, 8.4% Zn vacancies were formed. This is approximately ten times less than that caused by MBE or MOCVD in-situ doping.

Figure 7:
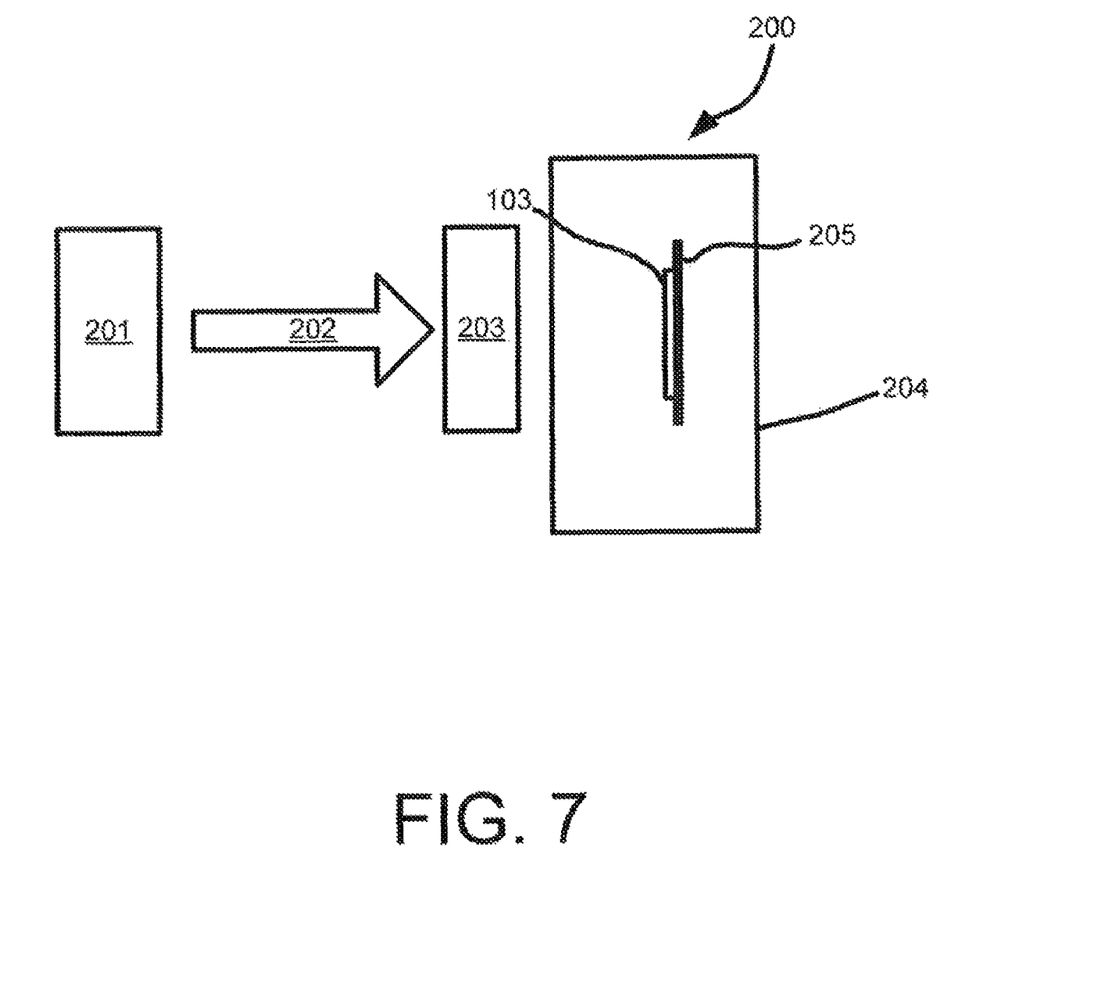
FIG. 7 is a simplified block diagram of a beam-line ion implanter.

FIG. 7 is a simplified block diagram of a beam-line ion implanter. Those skilled in the art will recognize that the beam-line ion implanter 200 is only one of many examples of differing beam-line ion implanters. In general, the beam-line ion implanter 200 includes an ion source 201 to generate ions that are extracted to form an ion beam 202, which may be, for example, a ribbon beam or a spot beam. The ion beam 202 of FIG. 7 may correspond to the first species 104, the second species 105, or the molecular species 109 of FIG. 2, 3, or 5.

The ion beam 202 may be mass analyzed and converted from a diverging ion beam to a ribbon ion beam with substantially parallel ion trajectories in one instance. The ion beam 202 also may not be mass analyzed prior to implantation. The beam-line ion implanter 200 may further include an acceleration or deceleration unit 203 in some embodiments.

An end station 204 supports one or more workpieces, such as the workpiece 103, in the path of the ion beam 202 such that ions of the desired species are implanted into workpiece 103. The end station 204 may include workpiece holder, such as platen 205, to support the workpiece 103. The workpiece holder also may be other mechanisms such as a conveyor belt. This particular end station 204 also may include a scanner (not illustrated) for moving the workpiece 103 perpendicular to the long dimension of the ion beam 202 cross-section, thereby distributing ions over the entire surface of workpiece 103.

The beam-line ion implanter 200 may include additional components known to those skilled in the art such as automated workpiece handling equipment, Faraday sensors, or an electron flood gun. It will be understood to those skilled in the art that the entire path traversed by the ion beam is evacuated during ion implantation. The beam-line ion implanter 200 may incorporate hot or cold implantation of ions in some embodiments. Hot implantation may use lamps, LEDs, a platen 205 or other workpiece holder that is heated, or other mechanisms known to those skilled in the art. Pre-heating the workpiece 103 may be performed on the workpiece holder, a separate area of the end station 204, or in a separate chamber of the beam-line ion implanter 200.

Figure 9:
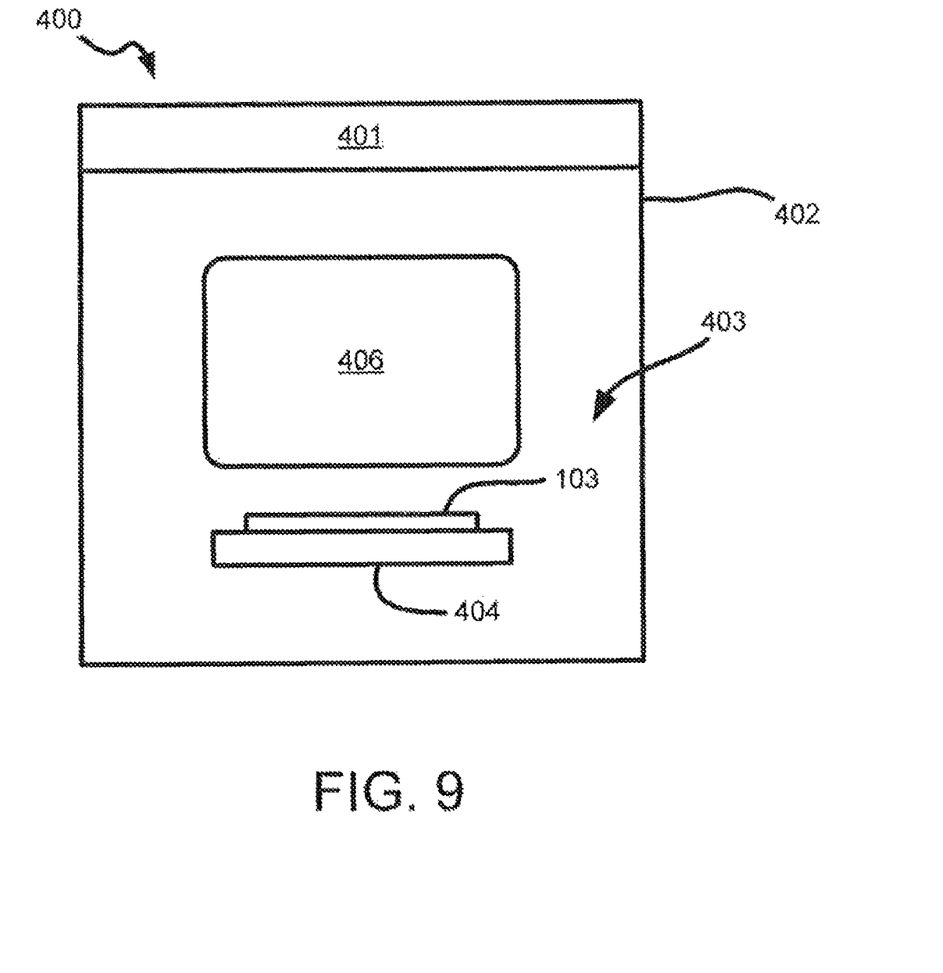
FIG. 9 is a block diagram of a plasma doping system.

Turning to FIG. 9, the plasma doping system 400 includes a process chamber 402 defining an enclosed volume 403. A platen 404 may be positioned in the process chamber 402 to support the workpiece 103. The workpiece 103 may be cooled or heated by a temperature regulation system, such as using the platen 404 or some other method. Thus, the plasma doping system 400 may incorporate hot or cold implantation of ions in some embodiments. The workpiece 103 may be clamped to a flat surface of the platen 404 by electrostatic or mechanical forces. In one embodiment, the platen 404 may include conductive pins for making connection to the workpiece 103.

The plasma doping system 400 further includes a source 401 configured to generate a plasma 406 from an implant gas within the process chamber 402. The source 401 may be an RF source or other sources known to those skilled in the art. The platen 404 may be biased. This bias may be provided by a DC or RF power supply. The plasma doping system 400 may further include a shield ring, a Faraday sensor, or other components. In some embodiments, the plasma doping system 400 is part of a cluster tool, or operatively-linked process chambers 402 within a single plasma doping system 400. Thus, numerous process chambers 402 may be linked in vacuum.

During operation, the source 401 is configured to generate the plasma 406 within the process chamber 402. In one embodiment, the source 401 is an RF source that resonates RF currents in at least one RF antenna to produce an oscillating magnetic field. The oscillating magnetic field induces RF currents in the process chamber 402. The RF currents in the process chamber 402 excite and ionize the implant gas to generate the plasma 406. The bias provided to the platen 404 and, hence, the workpiece 103 will accelerate ions from the plasma 406 toward the workpiece 103 during bias pulse on periods. The frequency of the pulsed platen signal and/or the duty cycle of the pulses may be selected to provide a desired dose rate. The amplitude of the pulsed platen signal may be selected to provide a desired energy. With all other parameters being equal, a greater energy will result in a greater implanted depth.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of doping comprising:
   implanting a ZnTe layer with a first species selected from Group III at a first energy; and
   implanting said ZnTe layer with a second species selected from Group VII at a second energy different from said first energy, wherein said first species and said second species are implanted to an equal depth within said ZnTe layer.

2. The method of claim 1, wherein said first species is selected from the group consisting of B, Al, Ga, and In and said second species is selected from the group consisting of F, Cl, Br, and I.

3. The method of claim 1, wherein said first species is Ga and said second species is I.

4. The method of claim 1, wherein said first species is Al and said second species is Cl.

5. The method of claim 1, wherein said implanting said first species and said implanting said second species occur at least partially simultaneously.

6. The method of claim 5, wherein said implanting said first species and said implanting said second species comprises ionizing $BF_3$ molecules at two different powers to form said first species and said second species.

7. The method of claim 1, wherein said ZnTe layer is at a temperature between 70° C. and 800° C. during said implanting said first species and said implanting said second species.

8. The method of claim 1, further comprising annealing said ZnTe layer after said implanting said first species and said implanting said second species.

9. The method of claim 1, further comprising heating said ZnTe layer above room temperature prior to said implanting said first species and said implanting said second species.

10. A method of doping comprising:
    implanting a ZnTe layer with a first species selected from Group III at a first energy, wherein said ZnTe layer is at a temperature between 70° C. and 800° C. during said implanting said first species; and
    implanting said ZnTe layer with a second species selected from Group VII at a second energy different from said first energy, wherein said ZnTe layer is at a temperature between 70° C. and 800° C. during said implanting said second species and wherein said first species and said second species are implanted to an equal depth within said ZnTe layer.

11. The method of claim 10, wherein said first species is selected from the group consisting of B, Al, Ga, and In and said second species is selected from the group consisting of F, Cl, Br, and I.

12. The method of claim 10, wherein said implanting said first species and said implanting said second species occur at least partially simultaneously.

13. The method of claim 12, wherein said implanting said first species and said implanting said second species comprises ionizing $BF_3$ molecules at two different powers to form said first species and said second species.

14. The method of claim 10, further comprising annealing said ZnTe layer after said implanting said first species and said implanting said second species.

15. The method of claim 10, further comprising heating said ZnTe layer above room temperature prior to said implanting said first species and said implanting said second species.

16. A method of doping comprising:
    implanting a ZnTe layer with a molecular species comprising an atom selected from Group III and an atom selected from Group VII, wherein said implanting occurs at two different implant energies and at two different powers that generate two different plasma densities of said atom selected from Group III and said atom selected from Group VII and wherein said atom selected from Group III and said atom selected from Group VII are implanted to an equal depth within said ZnTe layer.

17. The method of claim 16, wherein said atom selected from Group III is B, Ga, or Al and said atom selected from Group VII is F, Cl, or I.

18. The method of claim 16, wherein said ZnTe layer is at a temperature between 70° C. and 800° C. during said implanting.

19. The method of claim 16, further comprising annealing said ZnTe layer after said implanting.

20. The method of claim 16, further comprising heating said ZnTe layer above room temperature prior to said implanting.

* * * * *